(12) United States Patent
Dykaar

(10) Patent No.: US 9,455,307 B2
(45) Date of Patent: Sep. 27, 2016

(54) ACTIVE MATRIX ELECTRO-OPTICAL DEVICE AND METHOD OF MAKING THEREOF

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

(*) Notice: Subject to any disclaimer, the term of this patent is extended or adjusted under 35 U.S.C. 154(b) by 0 days.

(21) Appl. No.: 14/879,884

(22) Filed: Oct. 9, 2015

(65) Prior Publication Data
US 2016/0093681 A1 Mar. 31, 2016

Related U.S. Application Data

(63) Continuation-in-part of application No. 13/992,063, filed as application No. PCT/CA2012/000956 on Oct. 12, 2012, now Pat. No. 9,224,851, and a continuation-in-part of application No. 14/019,131, filed on Sep. 5, 2013, now Pat. No. 9,209,019.

(60) Provisional application No. 61/547,110, filed on Oct. 14, 2011.

(51) Int. Cl.
*H01L 27/32* (2006.01)
*H01L 51/56* (2006.01)
(Continued)

(52) U.S. Cl.
CPC ..... *H01L 27/3253* (2013.01); *H01L 27/14612* (2013.01); *H01L 27/14634* (2013.01);
(Continued)

(58) Field of Classification Search
CPC ... H01L 29/0657; H01L 24/16; H01L 24/81; H01L 24/13; H01L 25/065; H01L 2924/181; H01L 2924/15787; H01L 2924/10155; H01L 2224/16145; H01L 2924/00014; H01L 2924/10253; H01L 2224/45147
See application file for complete search history.

(56) References Cited

U.S. PATENT DOCUMENTS 3,025,335 A   3/1962   Ralph
3,649,354 A   3/1972   Te Velde
(Continued)

FOREIGN PATENT DOCUMENTS

CN    1373906 A       10/2002
DE    112006000411 A   2/2008
(Continued)

OTHER PUBLICATIONS

Gharghi, Majid, "Three-Dimensional Modeling and Simulation of p-n Junction Spherical Silicon Solar Cells", (Jun. 2006) IEEE Trans. Electron Devices, vol. 53, No. 6, pp. 1355-1363.
(Continued)

*Primary Examiner* — Jerome Jackson, Jr.
*Assistant Examiner* — Mohammed R Alam
(74) *Attorney, Agent, or Firm* — Perry + Currier, Inc.

(57) ABSTRACT

There is provided a method of forming an active matrix electro-optical device, the method comprising providing a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface, the controllable gated electronic component configured to control one or more pixels of the electro-optical device. The method also comprises providing an optical portion comprising one or more pixel regions, the optical portion electrically connected to the backplane such that at least one of the pixel regions of the optical portion is electrically connected to the controllable gated electronic component.

21 Claims, 12 Drawing Sheets

(51) Int. Cl.
H01L 51/52 (2006.01)
H01L 27/146 (2006.01)

(52) U.S. Cl.
CPC ... *H01L27/14636* (2013.01); *H01L 27/14658* (2013.01); *H01L 51/5246* (2013.01); *H01L 51/56* (2013.01); *H01L 27/3262* (2013.01); *H01L 2227/323* (2013.01)

(56) References Cited

U.S. PATENT DOCUMENTS

| | | | |
|---|---|---|---|
| 3,998,659 | A | 12/1976 | Wakefield |
| 4,136,436 | A * | 1/1979 | Kilby ..................... C25B 1/003 136/250 |
| 4,270,263 | A | 6/1981 | Johnson et al. |
| 4,470,874 | A | 9/1984 | Bartush et al. |
| 4,614,835 | A | 9/1986 | Carson et al. |
| 4,637,855 | A | 1/1987 | Witter et al. |
| 4,872,607 | A | 10/1989 | Jensen et al. |
| 5,069,740 | A | 12/1991 | Levine et al. |
| 5,091,319 | A | 2/1992 | Hotchkiss et al. |
| 5,377,031 | A | 12/1994 | Vu et al. |
| 5,469,020 | A | 11/1995 | Herrick |
| 5,945,725 | A | 8/1999 | Ishikawa |
| 5,955,776 | A * | 9/1999 | Ishikawa ................. C30B 25/18 257/1 |
| 6,204,545 | B1 | 3/2001 | Nakata |
| 6,464,890 | B2 | 10/2002 | Knappenberger et al. |
| 6,528,379 | B2 | 3/2003 | Takada et al. |
| 6,679,998 | B2 | 1/2004 | Knappenberger et al. |
| 6,744,073 | B1 * | 6/2004 | Nakata ................ H01L 25/0753 257/81 |
| 7,091,073 | B2 | 8/2006 | Inoue |
| 7,205,626 | B1 | 4/2007 | Nakata |
| 7,811,839 | B2 | 10/2010 | Kasahara et al. |
| 8,999,742 | B1 | 4/2015 | Lowenthal et al. |
| 2002/0011665 | A1 * | 1/2002 | Tatsumi ................ H01L 25/065 257/736 |
| 2002/0050061 | A1 | 5/2002 | Komyoji et al. |
| 2002/0153529 | A1 | 10/2002 | Shie |
| 2004/0016456 | A1 * | 1/2004 | Murozono ........ H01L 31/02008 136/250 |
| 2005/0127379 | A1 * | 6/2005 | Nakata ............. B32B 17/10036 257/84 |
| 2006/0185716 | A1 * | 8/2006 | Murozono ...... H01L 31/035281 136/250 |
| 2008/0121987 | A1 | 5/2008 | Chen |
| 2010/0052511 | A1 | 3/2010 | Keesmann |
| 2010/0167441 | A1 * | 7/2010 | Ray .......................... G09G 3/32 438/29 |
| 2010/0216076 | A1 | 8/2010 | Hong et al. |
| 2011/0186862 | A1 | 8/2011 | Harada et al. |
| 2011/0272706 | A1 | 11/2011 | Kwak et al. |
| 2014/0170690 | A1 * | 6/2014 | Ziegler .................. G01N 23/00 435/29 |

FOREIGN PATENT DOCUMENTS

| | | |
|---|---|---|
| EP | 1102332 A2 | 5/2001 |
| JP | 1986-171165 | 8/1986 |
| JP | 1989-276750 | 11/1989 |
| JP | 2001-230432 A | 8/2001 |
| JP | 2004-056014 A | 2/2004 |
| JP | 2011181534 A | 9/2011 |
| KR | 20080104947 A | 12/2008 |
| WO | 2005024951 A1 | 3/2005 |
| WO | 2013053052 A1 | 4/2013 |

OTHER PUBLICATIONS

International Search Report, Jan. 30, 2013, PCT/CA2012/000956.
"Extended European Search Report", European Patent Application No. 14182511.7, issued Jul. 14, 2015.
Omae, Satoshi, et al., "Crystal Characterization of Spherical Silicon Solar Cell by X-ray Diffraction", Japanese Journal pf Applied Physics, vol. 45, No. 5A 2006, pp. 3933-3937.
Zhu, Ting, et al., "Mechanics of a Process to Assemble Microspheres on a Patterned Electrode", Applied Physics Letters 88, 144101 (2006).
Wang, Y., et al., "Large-area Self Assembled Monolayers of Silica Microspheres Formed by Dip Coating", Materials Science-Poland, vol. 28, No. 2, 2010.
Xia, Deying et al., "Lithographically Directed Deposition of Silica Nanoparticles Using Spin Coating", Center for High Technology Materials and Department of Electrical and Computer Engineering, University of New Mexico, 1313 Goddard SE, Albuquerque, New Mexico 87106. (Published Dec. 14, 2004).
Victor V. Zhirnov, Victor V., et al. "New Frontiers: Self-Assembly and Nanoelectronics", Semiconductor Research Corp. Jan. 2001.
Takeda, Nobuo: "MEMS applications of Ball Semiconductor Technology", Ball Semiconductor Inc.
Choi, Jae Beom, et al., "TFT Backplane Technologies for AMCLD and AMOLED Applications", Journal of the Korean Physical Society, vol. 54. No. 1, Jan. 2009, pp. 549-553.
Hamer, John W., et al., "63.2: AMOLED Displays using Transfer-Printed Integrated Circuits", SID Symposium Digest of Technical Papers, vol. 40 Issue 1, pp. 947-950, Jun. 2009.
Findikoglu, Alp, et al., "Aligned-Crystalline Silicon Films on Non-Single-Crystalline Substrates", LosAlamos National Laboratory.
CBrite Marketing Document—Enabling the "displays of tomorrow", Today!
Rogers, J.A., et al., "Synthesis, Assembly and Applications of Semiconductor Nanomembranes", Nature, vol. 477, Sep. 1, 2001; pp. 45-51.
Tien, Joe, et al., "Microfabrication through Electrostatic Self-Assembly", Langmuir 1997, vol. 13, pp. 5349-5355.
Gharghi, Majid, et al., "Growth and Structural Characterization of Spherical Silicon Crystals Grown from Polysilicon", Journal of Electronic Materials, vol. 37, No. 11, 2008; pp. 1657-1664.
Sakariya, Kapil, et al., "Vt-Shift Compensating Amorphous Silicon Pixel Circuits for Flexible OLED Displays", Materials Research Society Symp. Proc. vol. 736, 2003; pp. D7.15.1 to D7.15.6.
Anonymous: AngstromSphere Dispersion Technique.
Kwon, Oh-Kyong: "TFT Mobility Requirement for AMOLED HDTVs" Division of Elecatrical and Computer Engineering, Hanyang University, Korea.
Zhao, L et al: "Novel Method for Fabricating Flexible Active Matrix Organic Light Emitting Diode (AMOLED) Displays" Copyright 2011 Hewlett-Packard Development Company, L.P.
Kim, Hyun, et al.: "A Review of Recent Advances in Backplanes and Color Patterning Technologies for AMOLED Display", Photonics Society Newsletters, Apr. 2013.
Talghader J.J.: "Integration of LEDs and VCSELs Using Fluidic Self-Assembly", Proceedings of SPIE, S P I E—International Society for Optical Engineering, US, vol. 3286, Jan. 28, 1998, pp. 86-95, XP000909119.
"Supplemental Partieal European Search Report", Apr. 30, 2015, issued on related European Application No. EP12839944.
McKee, William R.—Development of the Spherical Silicon Solar Cell; IEEE Transactions on Components, Hybrids and Manufacturing Technology, vol. CHMT-5, No. 4, Dec. 1982.
Findikoglu, Alp T., et al., "Well-Oriented Silicon Thin Films with High Carrier Mobility on Polycrystalline Substrates", Advance Matters 2005, vol. 17, pp. 1527-1531.
APN3001: Epoxy Die Attachment for GaAs Flip Chip Devices, Application Noe—APN3001, Skyworks Solutions, Inc., Jan. 29, 2008, http://www.skyworksinc.com/uploads/documents/200741A.pdf.
Clayton, James, E., et al., "Assembly Technique for a Fine-Pitch, Low-Noise Interface; Joining a CdZnTe Pixel-Array Detector and Custom VLSI Chip with Au Stud Bumps and Conductive Epoxy", Polymer Assembly Technology, Dept. of Physics, Mail Code 220-47, California Institute of Technology, http://www.polymerassemblytech.com/corp/papers/IEEENSSMICPaper.pdf, accessed Nov. 25, 2015.

(56) References Cited

OTHER PUBLICATIONS https://www.tedpella.com/technote_html/16014_H20E_TN.pdf, dated Mar. 2014.

Patterson, Tim, et al., Flip Chip on Flex Interconnect Guidelines, dated Nov. 1999, Smartlfex Systems, Inc., Tustin, CA, http://www.semicorp.com/articles/published-articles/item/flip-chip-on-flex-interconnect-guidelines.

http://www.creativematerials.com/applications/flip-chip/, accessed Nov. 25, 2015.

http://electroiq.com/blog/2005/05/flip-chip-attach-alternatives/, accessed Nov. 25, 2015.

http://www.tdcurran.com/blog/2015/10/07/why-the-iphone-6s-camera-is-the-best-ever, retrieved Dec. 3, 2015.

Office Action dated Mar. 21, 2016 for Chinese Patent Application No. 201280050565.X.

English Translation of Notice of Reasons for Rejection dated Jan. 12, 2016 for Related Japanese Patent Application No. 2014-534897.

English family patent version of CN1373906A. U.S. Patent Issued on Apr. 17, 2007.

Office Action dated Jul. 12, 2016 for Japanese Patent Application No. 2014-534897.

\* cited by examiner

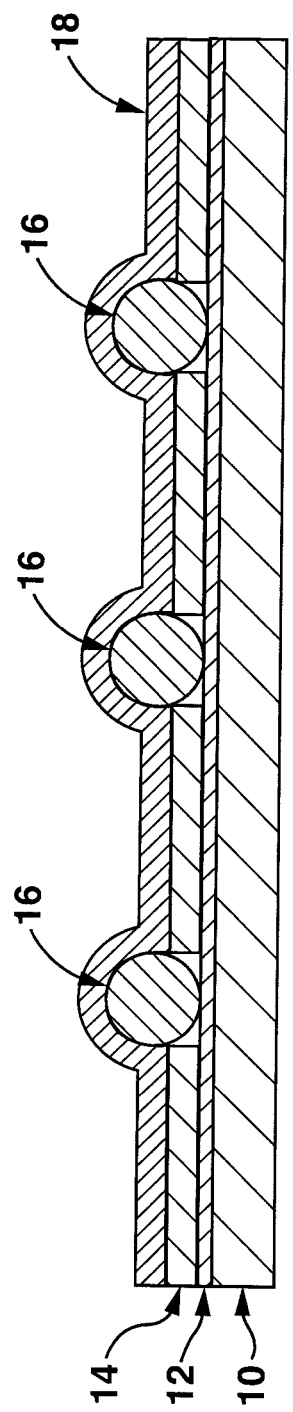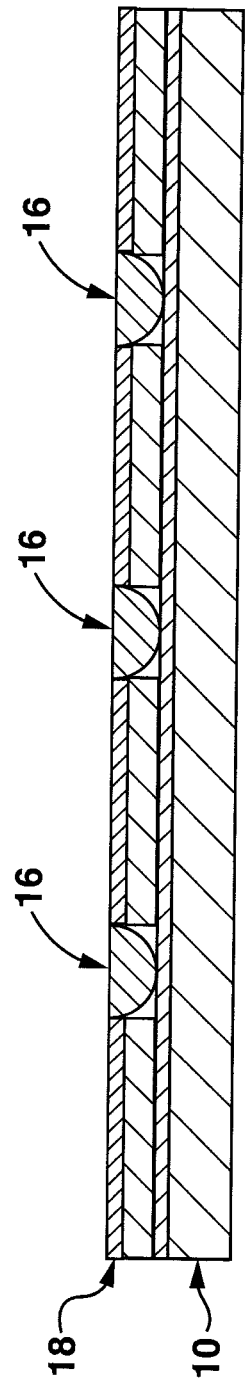
FIG. 3a
FIG. 3b

ACTIVE MATRIX ELECTRO-OPTICAL DEVICE AND METHOD OF MAKING THEREOF

CROSS-REFERENCE TO RELATED APPLICATION

This application is a continuation-in-part of U.S. patent application Ser. No. 13/992,063, which is the National Stage of International Application No. PCT/CA12/000956, filed Oct. 12, 2012, which claims the benefit of U.S. Provisional Application No. 61/547,110, the contents of which are incorporated herein by reference in its entirety. This application is also a continuation-in-part of U.S. patent application Ser. No. 14/019,131, filed on Sep. 5, 2013, which is incorporated herein by reference in its entirety.

FIELD OF THE INVENTION

The present invention relates to an active matrix electro-optical device and methods of making thereof, and in particular to an active matrix organic light emitting diode display and methods of making thereof.

BACKGROUND OF THE INVENTION

Single-crystal silicon is used for most electronic applications. Exceptions exist, such as displays and some imagers, where amorphous silicon is applied to glass substrates in order to operate the display or imager pixel. In many applications, the display or imager is fabricated on top of the silicon electronics. For application to liquid crystal displays (LCDs), amorphous silicon has provided sufficient performance. For next generation display devices such as Organic Light Emitting Diodes (OLED), Active Matrix (AM) drive transistors made from amorphous silicon have proven problematic. Fundamentally, LCDs use voltage devices, and AM-OLEDs require current devices. Attempts to extend the conventional approach involve modifying the prior-art amorphous-silicon on glass. Amorphous-silicon is applied to the entire substrate panel, typically greater than two meters on a side, then is re-crystallized using large excimer lasers and scanning a line focus across the panel. The laser has to be pulsed so as to only melt the Si surface and not the glass. This technique results in the formation of poly-crystal silicon rather than single-crystal silicon.

The mobility of any type of amorphous or poly-crystalline transistor, including non-silicon and organic devices, is much smaller than the mobility of single-crystal silicon transistors. Electron mobility in amorphous silicon is ~1 $cm^2/V \cdot s$ compared to ~100 $cm^2/V \cdot s$ for poly-silicon, and ~1500 $cm^2/V \cdot s$ for high-quality single-crystal silicon. It is therefore advantageous to use single-crystal silicon in place of amorphous silicon in such devices. In a preferred embodiment of the present invention a plurality of planar single-crystal silicon regions on a non-silicon substrate at predetermined locations, for the purpose of electronic device fabrication is fabricated. For example, wafers of single crystal silicon are too costly for large displays and too small in size: Silicon wafers are typically 300 mm in diameter, compared to current LCD panels at more than 2 meters on a side. By comparison, approximately spherical particles, spheres or spheroidal particles of single-crystal silicon have been manufactured in large sizes less than or equal to 2 mm, which is large compared to individual pixel sizes. U.S. Pat. No. 4,637,855, incorporated herein by reference, entitled Process For Producing Crystalline Spherical Spheres, Filed Apr. 30, 1985 in the names of Witter et al., describes the manufacture of crystalline spheres.

In the past others have attempted to place diodes upon a curved surface of a silicon spheroid however this has proved to be challenging. In the prior art, attempts have been made to lithographically define structures on spherical surfaces, but this requires non-standard optics and has had limited success. Making electrical contacts to non-planar surfaces also requires non-standard techniques. The complexities involved in fabrication have prevented any real progress.

Curved surfaces of Si spheres have also been doped with an n-type dopant to form n-type Si surrounding a p-type Si region which comprises the majority of the surface of a sphere. An embodiment of this invention relates to the field of photovoltaic devices, in that the planar surface and region directly below can be doped for example with an n-type dopant and a region below with a p-type dopant so as to form a solar cell. A silicon sphere solar cell is described in a paper entitled Crystal Characterization of Spherical Silicon Solar Cell by X-ray Diffraction by Satoshi OMAE, Takashi MINEMOTO, Mikio MUROZONO, Hideyuki TAKAKURA and Yoshihiro HAMAKAWA, Japanese Journal of Applied Physics Vol. 45, No. 5A, 2006, pp. 3933-3937 #2006 The Japan Society of Applied Physics.

This invention however overcomes the limitations of the aforementioned prior art by conveniently utilizing the surface area and region about the planar surface on a planarized particle to fabricate electronic devices. A planar region having structures formed therein provides a convenient reliable way in which to provide electrical contacts to different parts of the device.

Another very important aspect of this invention is that it enables a technology that has a smaller carbon footprint by allowing circuits to be built that consume less power than similar circuitry which utilizes LCD technology.

In displays with previous generation LCD technology, white light is provided to the rear of the panel of the display, and each LCD pixel uses a filter to select Red (R), Green (G), or Blue (B) light. Filtering in this manner wastes ⅔ of the energy in the backlight. In addition the operation of the LCD pixel is dependent on the light being polarized, so further losses are incurred by the polarizer. In addition, part of each pixel is occupied by the amorphous silicon transistor, which blocks light coming through the panel.

The present invention enables production of large OLED panels, which are more efficient that LCD panels. OLED pixels emit at the desired color, R, G, or B only, so no energy is wasted creating other colors, which are then filtered out and which produce waste in the form of heat. In addition, the OLED emitters can be fabricated on top of the backplane electronics, so the emission area can be maximized without blocking light emitting areas of the pixel. By placing the backplane electronics out of the light path, the design can be optimized for speed and low power dissipation, as opposed to being compromised for light path requirements.

SUMMARY OF THE INVENTION

According to an embodiment of the present invention there is provided a method of forming an active matrix OLED display, the method comprising: providing a backplane comprising: providing a backplane substrate; providing semiconductor particles formed separately from the backplane substrate; positioning the semiconductor particles at predetermined positions on the backplane substrate; immovably fixing the semiconductor particles to the backplane substrate at the predetermined positions; after immovably fixing the semiconductor particles, removing portions of each of the semiconductor particles so as to expose cross-sections of the semiconductor particles, wherein the cross-sections are planar surfaces; and providing one or more controllable gated electronic components on or directly beneath each planar surface, the controllable gated electronic components configured to control pixels of the active matrix OLED display. The method also comprises providing an OLED assembly comprising one or more pixel regions, the OLED assembly electrically connected to the backplane such that at least one of the pixel regions is electrically connected to corresponding one or more of the controllable gated electronic components.

The planar surfaces can be less than 15 mm and greater than 1 µm across a longest dimension; and the providing the backplane can further comprise providing at least two electrical contacts to each controllable gated electronic component supported by the planar surface.

According to another embodiment of the present invention there is provided a method of forming an active matrix OLED display, the method comprising: providing a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface, the controllable gated electronic component configured to control one or more pixels of the active matrix OLED display. The method further comprises providing an OLED assembly comprising one or more pixel regions, the OLED assembly electrically connected to the backplane such that at least one of the pixel regions of the OLED assembly is electrically connected to the controllable gated electronic component.

The OLED assembly can be formed separately from the backplane on an OLED substrate different from the backplane substrate, the OLED assembly comprising one or more pixel contacts corresponding to each pixel region; and the providing the OLED assembly electrically connected to the backplane can comprise: joining the OLED assembly to the backplane, the joining comprising electrically connecting at least one of the pixel contacts corresponding to the at least one of the pixel regions to the controllable gated electronic component.

The method can further comprise: before the joining, aligning the OLED assembly and the backplane with each other in order to align the at least one pixel contact corresponding to the at least one of the pixel regions with the controllable gated electronic component.

The method can further comprise backfilling with a substantially black underfill at least a portion of gaps between the OLED assembly and the backplane joined together.

The electrically connecting can comprise using one or more of a conductive epoxy, a solder, and low temperature solder to connect at least one of the one or more pixel contacts to the controllable gated electronic component.

The backplane can further comprise: a conformal coating covering the backplane substrate and at least a portion of the semiconductor particle; and wherein: the semiconductor particle can be planarized to further remove portions of the conformal coating; the planar surface can be less than 15 mm across its longest dimension; at least a portion of the semiconductor particle directly below or on the planar surface can be doped with a first dopant of a first type and wherein another portion of the semiconductor particle directly below or on the planar surface can be doped with a second dopant of a second type, one of the first and second dopants being n-type; and the controllable gated electronic component can comprise: a first contact at or above the planar surface contacting the first dopant; and, a second contact at or above the planar surface contacting the second dopant; and the electrical connection can comprise a conductive link between one of the first contact and the second contact and the at least one pixel region.

According to another embodiment of the present invention there is provided an active matrix OLED display comprising: a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface; and an OLED assembly comprising one or more pixel regions, the OLED assembly electrically connected to the backplane such that at least one pixel region of the OLED assembly is electrically connected to the controllable gated electronic component, the electrical connection configured to allow the controllable gated electronic component to control the at least one pixel region of the OLED assembly.

The active matrix OLED display can further comprise a substantially black underfill filling at least a portion of gaps between the OLED assembly and the backplane joined together.

The active matrix OLED display wherein the backplane can further comprise: a conformal coating covering the backplane substrate and at least a portion of the semiconductor particle; and wherein: the semiconductor particle can be planarized to further remove portions of the conformal coating; the planar surface can be less than 15 mm across its longest dimension; at least a portion of the semiconductor particle directly below or on the planar surface can be doped with a first dopant of a first type and wherein another portion of the semiconductor particle directly below or on the planar surface can be doped with a second dopant of a second type, one of the first and second dopants being n-type; and the controllable gated electronic component can comprise: a first contact at or above the planar surface contacting the first dopant; and, a second contact at or above the planar surface contacting the second dopant; and the electrical connection can comprise a conductive link between one of the first contact and the second contact and the at least one pixel region.

According to another embodiment of the present invention there is provided an imager comprising: a detector assembly for detecting photons and, in response, producing an electrical signal; a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface; and an electrical connection between the controllable gated electronic component and the detector assembly, the electrical connection configured to allow the controllable gated electronic component to sample the electrical signal.

The detector assembly can be an X-ray detector.

The imager wherein the backplane can further comprise: a conformal coating covering the backplane substrate and at least a portion of the semiconductor particle; and wherein: the semiconductor particle can be planarized to further remove portions of the conformal coating; the planar surface can be less than 15 mm across its longest dimension; at least a portion of the semiconductor particle directly below or on the planar surface can be doped with a first dopant of a first type and wherein another portion of the semiconductor particle directly below or on the planar surface can be doped with a second dopant of a second type, one of the first and second dopants being n-type; and the controllable gated electronic component can comprise: a first contact at or above the planar surface contacting the first dopant; and, a second contact at or above the planar surface contacting the second dopant; and the electrical connection can comprise a conductive link between one of the first contact and the second contact and the detector assembly.

According to another embodiment of the present invention there is provided a method of fabricating a backplane, the method comprising: providing a backplane substrate comprising one or more predetermined positions each configured to receive one semiconductor particle; providing semiconductor particles formed separately from the backplane substrate; placing the semiconductor particles on the backplane substrate; mechanically agitating the backplane substrate and the semiconductor particles to cause one semiconductor particle to occupy each position; securing the semiconductor particles to the backplane substrate at each respective position; and after the securing the semiconductor particles at each respective position, removing portions of each of the semiconductor particles so as to expose cross-sections of the semiconductor particles, the cross-sections being planar surfaces.

The method can further comprise: providing at least one controllable gated electronic component on or directly beneath each planar surface.

The mechanically agitating can comprise vibrating the backplane substrate.

The mechanically agitating can comprise one or more of: rotating the backplane substrate about one or more axes; and translating the backplane substrate in one or more directions.

The securing can comprise, before the placing the semiconductor particles on the backplane substrate, applying an adhesive to each position, the adhesive configured to secure at least one semiconductor particle at each respective position to the backplane substrate.

The securing can comprise heating the semiconductor particles and the backplane substrate to fuse the semiconductor particles to the backplane substrate.

The securing can comprise, after the mechanically agitating, applying a conformal coating onto the backplane substrate to at least partially cover the semiconductor particles and the backplane substrate; and the removing can further comprise removing at least a portion of the conformal coating covering the semiconductor particles to expose the planar surfaces.

BRIEF DESCRIPTION OF THE DRAWINGS

Exemplary embodiments of the invention will now be described in accordance with the drawings in which:

FIG. 3a is a cross-sectional view of semiconducting spherical particles deposited on a gridded substrate having a conformal coating deposited on top of the spherical particles.

FIG. 3b is a cross-sectional view of the semiconducting spherical particles shown in FIG. 3a after being planarized.

DETAILED DESCRIPTION OF THE INVENTION

Figure 1:
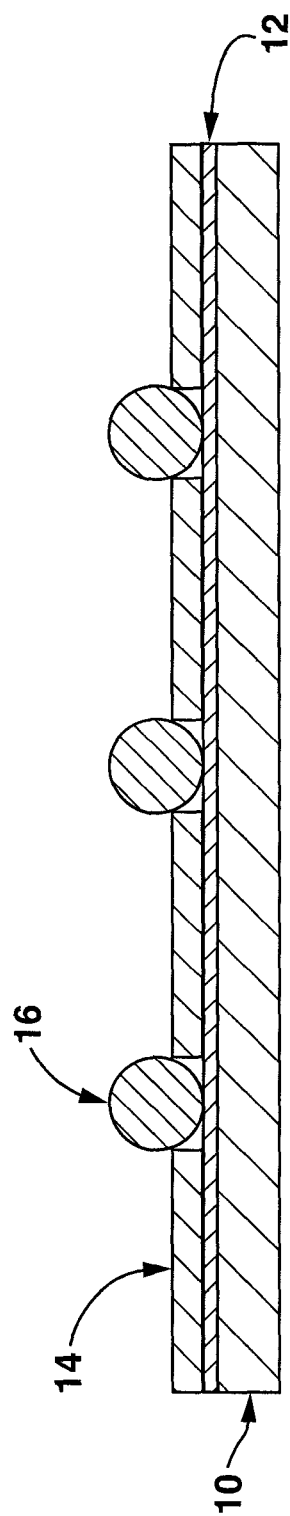
FIG. 1 is a cross-sectional view of an array of semiconducting spheres placed adhesively upon a substrate so as to permanently affix the spheres at predetermined locations.

Turning now to FIG. 1 a substrate 10 is shown which may be plastic, glass, semiconductor material or any other suitable stable material for supporting an electronic circuit. An adhesive layer 12 is applied to an upper surface of the substrate 10 which has a grid 14 having predetermined gaps between grid elements suitably sized to contain semi-conducting spheres 16, having a diameter of less than 15 mm and preferably less than 2 mm. The term semiconducting sphere, used hereafter, is to include spheres, spheroids and semiconducting sphere-like objects which may have imperfections, due to defects in forming the spheres. The arrangement shown in FIG. 1 conveniently allows a circuit designer to have a great deal of control in determining where spherical semiconducting material is to be located, and as a result, where semiconductor devices residing on planar surfaces of the spheres 16 are to be fabricated after the spheres are planarized. Although the grid is shown with same spacing between grid openings, a grid having non-uniform spacing can be used to locate spheres in any desired pattern. If the electronic devices were fabricated on the planar surfaces prior to positioning the spheres on the substrate, orienting the spheres would be very difficult. Therefore, the semiconducting spheres 16 are first fixedly attached to the substrate 10 and are subsequently planarized so as to expose regions of high-quality semi-conductor material within the interior of the sphere suitable for fabrication of silicon electronics; by way of example, CMOS devices can be formed at the planar layer by doping the material of the sphere at the planar layer and beneath. Spherical particles are described in detail and are particularly convenient to position and planarize, however many other particle shapes can be used, as long as the particles can be positioned and secured to a substrate conveniently and as long as the particles can be planarized so as to provide a surface on which to fabricate electronic devices.

Typically, for most chip-based electronics, the unused chip area is reduced to a minimum so the device density is high. The density is so high, that the unused substrate area wasted by not having an active device fabricated thereon is small. In displays and imagers, the device area is specified by requirements that are not electronic. As a result, as the displays become larger, the device density becomes lower. At some point, coating several square meters with low-quality Si to make a few devices, or a few million compared to 100s of millions in a PC CPU, is no longer desirable. In accordance with this invention, high-quality Si is placed only where it is needed, thereby covering a lower fraction of the total display area for large displays. This technological inflection point should occur as a result of the impending crossover to faster OLED devices. OLEDs are current devices, and amorphous silicon on glass cannot deliver the required current and speed.

Silicon spheres have been used previously to manufacture large area photo-voltaic panels as described in U.S. Pat. No. 4,614,835 Photovoltaic Solar Arrays Using Silicon Microparticles, Filed Dec. 30, 1983, in the names of Carson et al, incorporated herein by reference. For photo-voltaic applications the surface of the sphere forms the active area. Silicon spheres can be made from low cost powdered silicon and the resulting re-crystallized surface layer of silicon dioxide can getter significant impurities. Repeated melting cycles can improve the overall material purity. Even in the case of poly-crystalline particles, the electron mobility is many times that of amorphous silicon.

In accordance with this invention, it was discovered that for electronic devices, it is preferable to fabricate devices using the flat surface of a cross section of a semiconductor particle such as a sphere rather than the curved outer surface. The flat surface allows the use of standard lithography techniques, allowing the fabrication of transistors, interconnects, etc. For example, a silicon sphere 20 microns in diameter, provides a maximum area, $A=\pi \times r^2 =\sim 314$ microns$^2$ for device fabrication. Many transistors with gate lengths on the order of 1 micron can be fabricated within such an area. For large area displays, only a few transistors are required for each pixel and pixel size does not scale with display size; High Definition (HD) is a standard resolution (e.g. 1920×1080 pixels). In addition, one flat area of high quality, single-crystal silicon can service more than one pixel, as well as provide added functionality such as self-test and display performance monitoring and correction.

The use of the flat cross section of a planarized particle such as a truncated planarized sphere allows the use of standard photolithographic fabrication techniques. Furthermore, by planarizing, imperfections that occur on the surface of the sphere or spheroid are removed as the sphere or spheroid is etched or polished to expose the inner region. Conveniently, because the spheres are purified in a separate process, high-purity single-crystal material can be realized using high temperature processes not available to amorphous silicon on glass substrates as the glass substrate melts at temperatures lower than standard silicon processing temperatures. This is even more important for lower melting temperature substrates such as plastics. Truncated spheres or planarized particles of other shapes can be doped, or multiply doped just below or above their planar surface to form rings of n-type and p-type material or "wells" when the cross section is exposed; doping can also occur later in the process. This will allow the fabrication of CMOS devices as is shown in FIG. 5. Although the preferred way in which to dope a region is by ion-implantation, doping can also be achieved by spin-coating dopants onto the planarized surface. The outer surface can be highly doped or metallized to form a substrate contact that can be contacted from either the edge of the top surface or from anywhere on the spherical surface, which is the effective backside. The term contact used in this specification can be a physical wire, or a metallized contact region such as a conductive contact pad whereby a lead or wire or device can make electrical contact.

The present invention provides spherical silicon particles at known locations on a substrate, which is preferably a non-silicon substrate. Positioning the silicon spheres on a substrate can be done by any of several techniques. Most involve patterning the substrate with a plurality of locations in which spheres are to be placed. Metal or dielectric grids can be permanently or temporarily applied to the substrate first, or standard photolithographic techniques can be used. Alternatively dots, dimples, or other patterns of adhesive can be applied to locate the spheres. Adhesive material with a melting point or adhesive at room temperature appropriately matched to subsequent electronic processing should be chosen.

As an alternative to a deposited or applied grid, the substrate can be patterned directly, using standard lithographic techniques to make holes in the substrate in which to deposit adhesive for fixing the semi-conductor spheres. In some embodiments, a fireable ceramic material can be used as the substrate. Holes can be made in the green, i.e. unfired, ceramic using techniques including, but not limited to, punching or drilling.

In another embodiment, silicon particles can be used to form a monolayer on the substrate surface in substitution for non-semiconducting spheres used to form a mask, described in U.S. Pat. Nos. 6,464,890, and 6,679,998 Knappenberger et al. filed Aug. 29, 2001 and August 23 respectively, incorporated herein by reference. As long as the particles are a predetermined size, then subsequent processing can provide for planarized silicon particles such as spherical particles in the required locations.

In FIG. 1 an exemplary technique is shown whereby a metal grid 14 is used with an adhesive layer 12. Spheres 16 are subsequently placed on the surface in sufficient quantity such that the use of mechanical vibration to move the spheres around on the grid results in complete occupation of the grid openings. The mechanical vibration causes the silicon spheres 16 to move around the volume defined by the substrate, walls and a cover. In a very short time, the spheres 16 move around to such a degree that the probability of encountering an available grid location is unity, as long as spheres are still available. It is contemplated that other types of mechanical agitation can be used instead of and/or in addition to vibration. For example, the substrate, with the spheres placed on it, can be rotated about one or more axes and/or translated in one or more directions.

Figure 2:
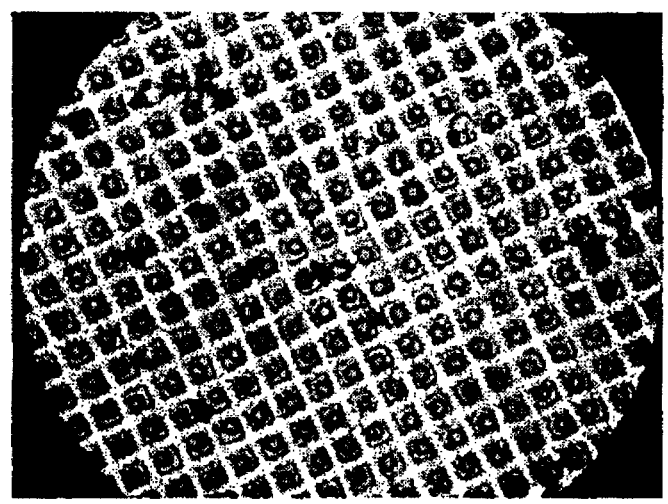
FIG. 2 is a photograph of an array of single-crystal Si spheres disposed upon a non-silicon substrate.

FIG. 2 shows a photomicrograph of such a device made on a glass substrate with a grid. In this exemplary case, glass spheres are used and are 20 microns in diameter. Mechanical vibration was used to move the glass spheres around on the grid. High voltage (V≤12 kV) was then applied to the grid to help remove spheres from the top surface of the grid.

Some excess spheres and dirt can also be seen, but these would be reduced or eliminated in a clean room environment and/or removed in subsequent processing steps.

For large areas, spheres can be applied in a dense line across the surface in one direction and then vibrated across the surface of the substrate in a wave. In some embodiments, semi-conductor particles can be placed on the surface of the substrate to substantially or entirely cover the surface of the substrate before mechanically agitating the substrate and the semi-conductor particles.

It is contemplated that similar techniques, using mechanical agitation, can be used, whereby the substrate comprises through holes at predetermined positions for at least partially receiving the semi-conductor particles. A layer of adhesive can be applied to one face of the substrate, with the adhesive layer covering one end of the through holes. The semi-conductor particles can be placed on the other face of the substrate, opposite the face bearing the adhesive layer, and then the substrate and the semi-conductor particles can be mechanically agitated to cause the semi-conductor particles to at last partially occupy the holes in the substrate. The semi-conductor particles can adhere to the portions of the adhesive layer accessible through the holes, and as a result be retained and/or secured in the holes. The adhesive layer can comprise glass paste or other suitable adhesive known to the skilled person.

Alternatively, electric fields can be applied using external electrodes in order to move the particles on the substrate as described in "Mechanics of a process to assemble microspheres on a patterned electrode," Ting Zhua, Zhigang Suob, Adam Winkleman and George M. Whitesides, APPLIED PHYSICS LETTERS 88, 144101 (2006), hereafter referred to a reference 1. In this approach an electric potential is created using a bottom electrode placed underneath the dielectric substrate and the conductive grid is used as the counter electrode. The holes in the grid create a potential well that the spheres can drop down into. The electric field gradient around the hole is sufficient to create a net force acting on the particle. For large enough applied fields (KV), the particles can be moved into the holes. Vibration may be required initially, to move the spheres around so that they encounter the potential well.

In another approach, a similar process to that used in laser printing can be utilized. In laser printers, triboelectrically generated charge is applied to toner particles. The charged toner particles are then applied to an electrostatically charged (drum) substrate. In laser printing the toner particles are then transferred to an electrostatically charged substrate typically paper. In laser printing the laser is used to write the pattern on the charged drum, but since the pattern wouldn't change in a production environment, the laser can be replaced by a grid. In first generation laser printers, toner particle size of approximately 16 microns was on the same order as the spheres of FIG. 2. By applying a voltage to an electrode underneath the dielectric substrate to attract the charged spheres, and the opposite polarity to the grid, the spheres are selectively attracted to the holes. This approach can be viewed as an enhancement of the approach described in reference 1.

In an alternative embodiment of the present invention, the array of spheres could then be transferred from the first substrate, acting similarly to laser printer drum, to another, un-patterned substrate, acting similarly to the charged paper, in a complete analogy to laser printing described. Alternatively, transferring of the array from first to second substrates can also be accomplished if the adhesive on the second, un-patterned substrate, or adhesive applied to the spheres has a higher melting temperature, greater adhesion or electrostatic attraction, for example. While the exemplary device of FIG. 1 uses an adhesive layer, the substrate or grid under layer can be a heat-softened layer, such as thermoplastic layer at elevated temperature so the spheres adhere on contact and remain in place when the substrate is cooled to ambient temperature. The adhesive can be a thin layer applied to substrate. The relatively small size of the spheres means that significant contact area is achieved for a small layer thickness of adhesive.

Since silicon has a higher melting temperature than glass, a glass substrate can be used directly if sufficiently heated to soften the glass and so allow the spheres, either coated with silicon dioxide or stripped of oxide, to adhere directly to the glass, providing an assembly that can be subjected to higher post-processing temperatures. This can be accomplished by transferring the arrayed particles from a patterned substrate onto un-patterned glass using electrostatic attraction, as in laser printing. By fixing the particles directly to the glass the window for higher temperature processing can be extended to the point where the cross sectional interior of the semi-conducting spheres is exposed. The same printing process can be used for other substrates.

Once the spheres 16 are in place, a conformal coating 18 is applied and subsequently planarized using a modification of the standard planarization techniques, such as chemo-mechanical polishing, as shown in FIG. 3a where the coating layer 18 of $SiO_2$ is shown covering the spherical particles 16 and the grid 14. FIG. 3b shows the same array of FIG. 3a after planarization and before devices are fabricated on the truncated spheres in the form of hemispheres. Standard planarization techniques used in integrated circuit fabrication can be utilized. Planarization can occur multiple times in the process because as multiple layers are deposited sequentially, the topography can exceed that supported by the process, therefore after a conformal dielectric coating is applied it is then planarized; and when a conductive coating is applied it is then planarized. Connections between layers are made by opening holes or vias at lithographically defined locations and depositing conductive connections or plugs between layers. This is particularly advantageous. In the case of a planarized metal layer, the layer would be patterned to form the required interconnects. In the present invention, the process of planarization is performed to expose the interior cross-section of the semiconductor particles, as opposed to the prior art of planarizing the surface without exposing all of the underlying elements, as described in U.S. Pat. No. 4,470,874, entitled Planarization of multi-level interconnected metallization system, filed Dec. 15, 1983, incorporated herein by reference.

Although the silicon spheres are placed with random orientation, the anisotropy of mobility in Si is small, so the resulting devices that are fabricated will be much higher performance than those made using amorphous- or poly-silicon. However, if the application is less demanding and for example does not require high-speed devices, then poly-silicon or non-spherical particles can be used.

While spherical particles are preferred, powdered silicon can be used, either single- or poly-crystal, if appropriate to the performance requirements of a particular application. In addition, multiple placement cycles can be used to place particles of different sizes, or different material characteristics, such as doping or crystalline quality or atomic species, such III-V, for example GaAs, or quaternary alloys for use as optical sources, or SiGe, to realize different functionality in the final device.

Figure 5A:
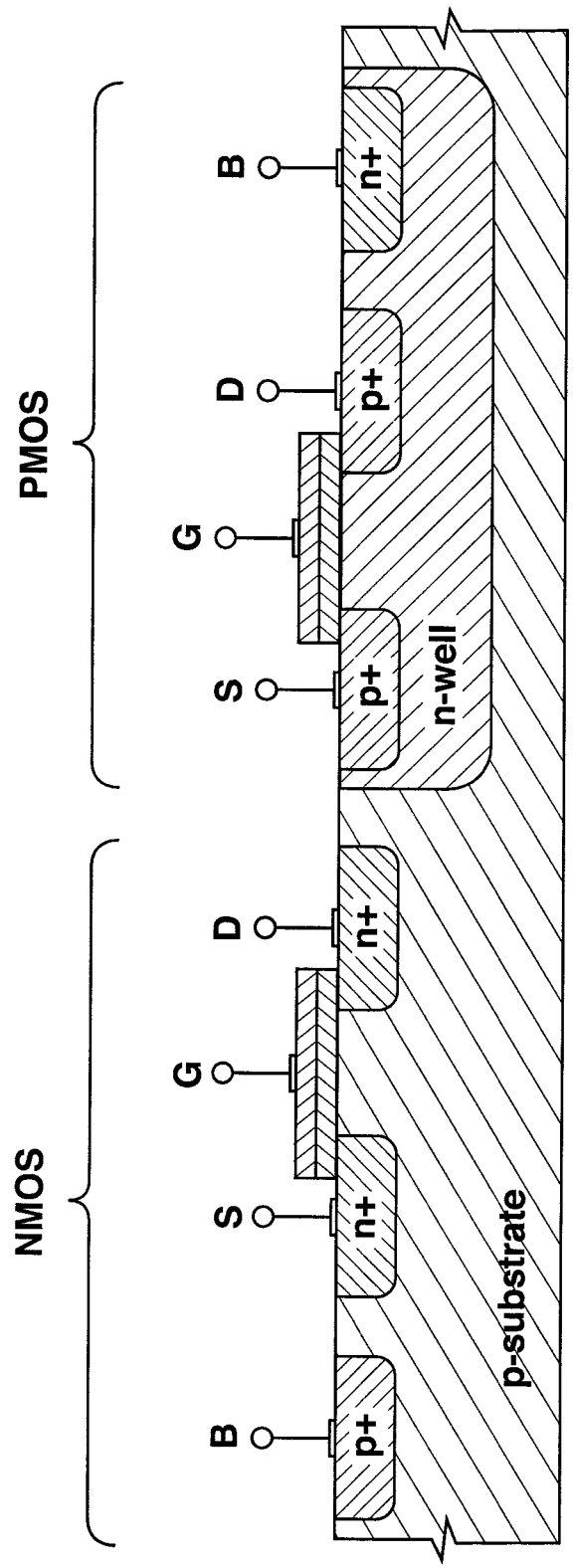
FIG. 5a is a partial cross-sectional view of complementary NMOS and PMOS circuits formed on a planarized semiconducting particle doped with a p-type material when forming the particle.
Figure 5B:
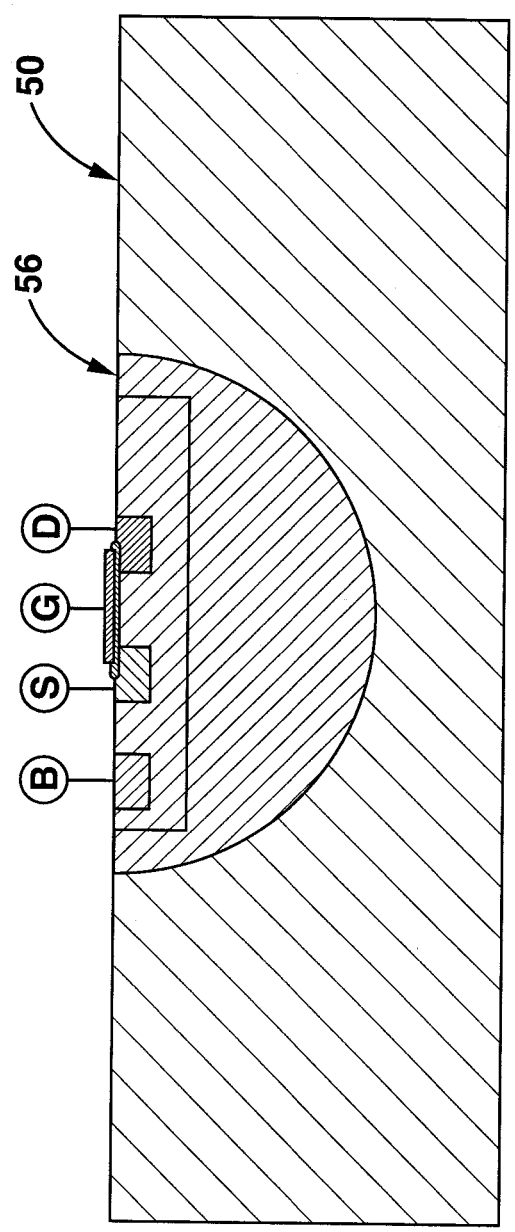
FIG. 5b is a cross-sectional view of a single transistor device fabricated within a single planarized sphere.

Standard photolithographic techniques are used to fabricate devices on the exposed silicon surfaces as well as fabrication of interconnects and other elements required for device functionality. The present invention allows for nearly conventional CMOS devices to be fabricated; and, it may be advantageous to utilize other processes. The present invention does not intrinsically restrict the type of process that can be used. For example, particles of n and p type silicon can be deposited in separate steps, to achieve n- and p-wells using separate silicon particles. In conventional CMOS, the n-well shown in FIG. 5a must be fabricated within the global p-type substrate. Turning now to FIG. 5b, a device similar to that of FIG. 5a is shown fabricated within a spherical particle that is doped with a p-type material for form a p-type sphere. In this figure a semi-spherical semiconductor device 50 is shown wherein a planarized sphere 56 forms a gated semiconductor transistor device having a source (S), drain (D) and Gate (G) as well a contact B which forms a substrate bias as the device is within a doped well, as shown. In this instance a single device is formed within the planarized semiconducting sphere. Each of the lines extending from the device to B, S, D, and G are electrical contacts. The number of separate devices that can be manufactured on within/upon a single crystal particle depends greatly on the size of the planarized region. For example if the device has a 1 µm gate length and 1 µm via holes, the entire device maybe 5 µm×5 µm device. However, a sphere with a 20 µm diameter would have a surface area of greater than 300 µm$^2$ which could accommodate several devices. By way of example a 2×2 pixel array or a single pixel with additional circuitry for example for lifetime-control could be inbuilt. Considerations of sphere size would be cost, reliability and yield. The device shown in FIG. 5a could be fabricated on any or all of the planar spheres shown for example in FIG. 3b.

Figure 5C:
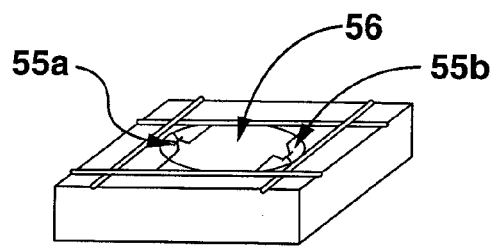
FIG. 5c is an isometric view of a circuit with symbolic representation of gated transistors shown in a planarized spherical particle. This single cell could also form a stand-alone circuit, be packaged and function as a standalone device, replacing a similar device fabricated on a silicon wafer.
Figure 5D:
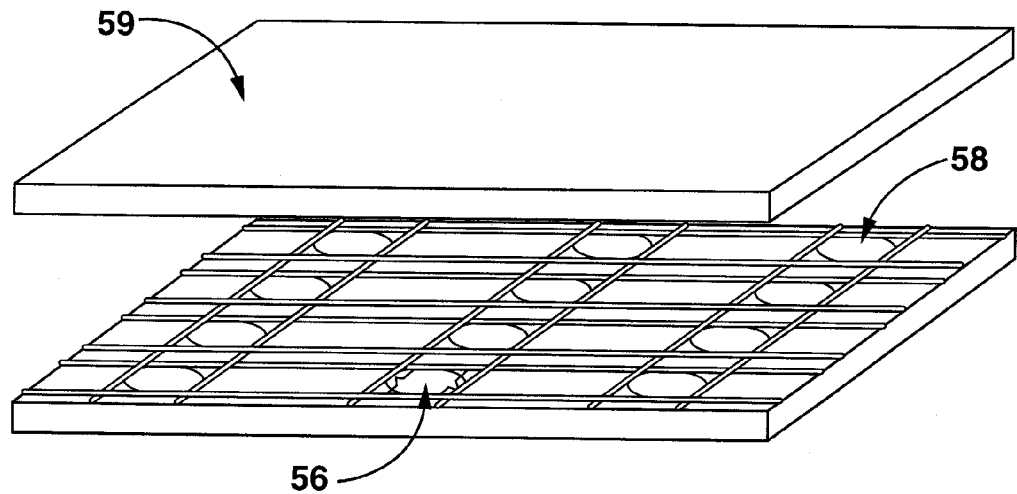
FIG. 5d shows the spherical particle of FIG. 5b illustrating that an array of such particles can be manufactured in adjacent particles not shown to have transistors therein.
Figure 6A:
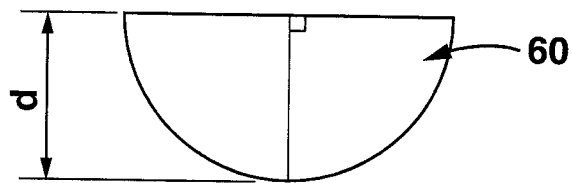
FIGS. 6a through 6d are cross-sectional views of particles wherein the maximum depth is shown normal to a planarized surface.
Figure 6B:
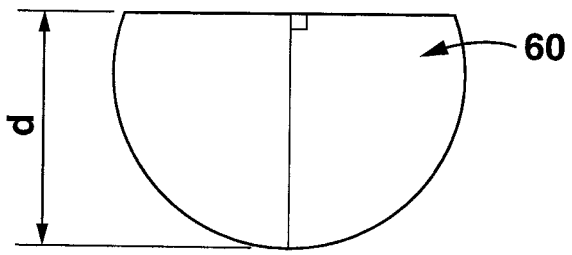
Figure 6C:
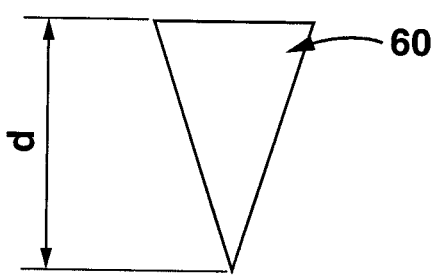
Figure 6D:
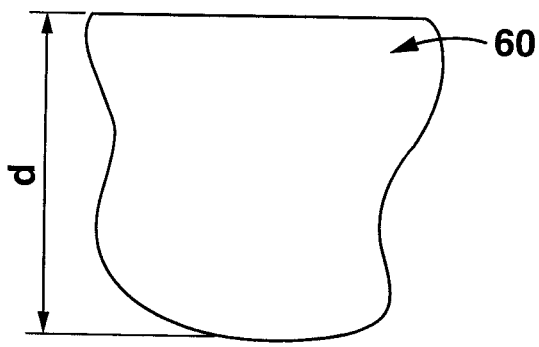

A symbolic representation of transistors 55a 55b is shown in FIGS. 5c and 5d. Further doping occurs to achieve the NMOS and PMOS devices in the same sphere. In FIG. 5c an array of controllable functional devices such as transistors can be fabricated. Although not shown in the array 58 of planarized spheres 56, an array of devices would be manufactured within the same process. That is, doping would be done to all transistors at the same time. A passivation layer 59 is applied directly over top of the planarized spheres after devices are fabricated. The layer 59 is shown before it is laid down over the active devices. Although an advantage of this invention is that an array of any size can be manufactured it may be desired to cut up the array into smaller functional units which can be placed in desired locations. Current means for cutting silicon wafers can be used in this instance.

The resulting electronic assembly can then be used as the basis for a variety of devices such as displays, or imagers.

In accordance with an aspect of this invention non-glass substrates, such as plastic, Mylar, polyimide or other application appropriate material, can also be used, allowing not only decreased cost of production, but also the realization of both flexible and moldable devices. As the dimensions of the semiconductor particle are reduced, the minimum bend radius is also reduced. For silicon particles, which are smaller than the substrate thickness, the mechanical properties will be largely dictated by the non-silicon elements of the device and so can be made either flexible or moldable or a combination thereof. Devices can also be fabricated where the mechanical properties vary throughout the device, where the mechanical stiffness is specified as a function of position within the device.

In a further variation of the present invention, large substrates can be cut to form small devices, in the same way that silicon wafers are cut into devices of a preferred size; the device is small relative to the substrate. The present techniques would applicable where the costs and performance allowed the use of non-silicon substrates. In many silicon devices for example, the area occupied by the contact pads and interconnects can be on the same order as the device area. In other applications, device performance can be enhanced by using a substrate with a large thermal conductivity. Here the spherical backside of the particle provides a larger surface through which heat can be removed.

Figure 4A:
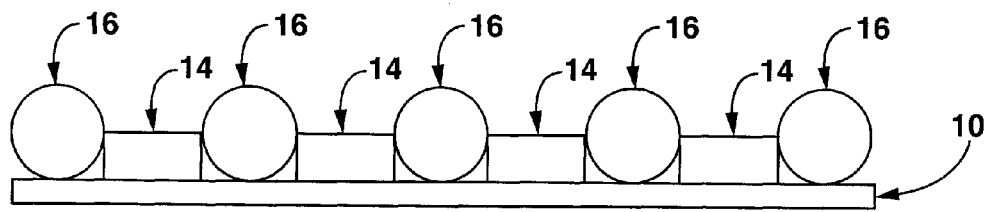
FIGS. 4a through 4f show the method of forming contacts on the planar surface and to the outside surface of a sphere for example, for providing an array of solar cells.
Figure 4B:
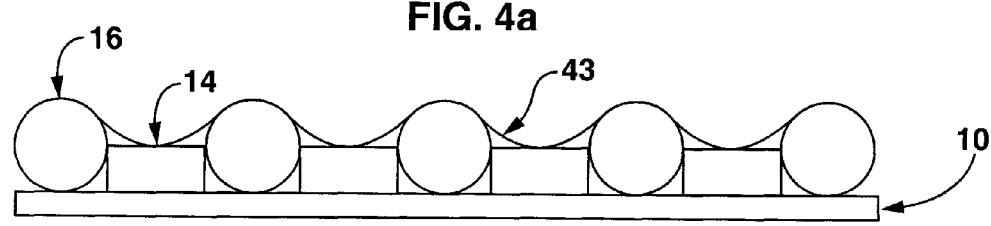
Figure 4C:
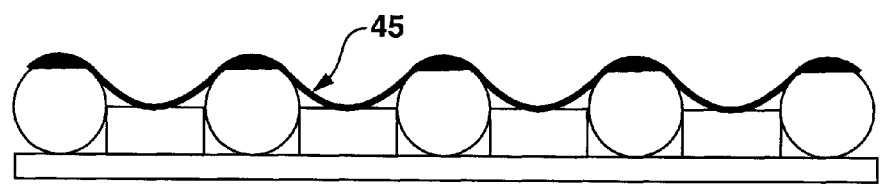
Figure 4D:
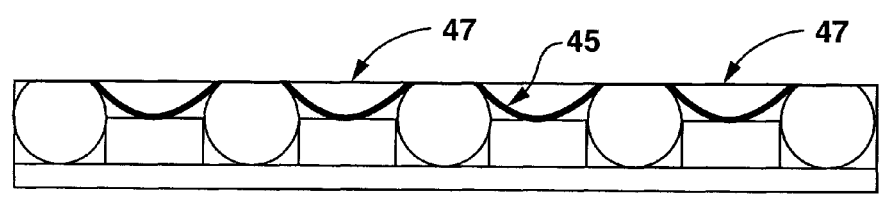
Figure 4E:
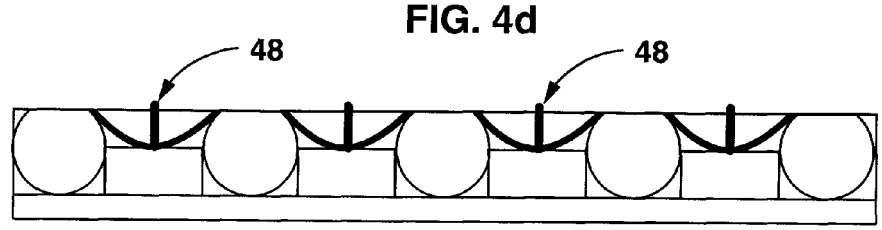
Figure 4F:
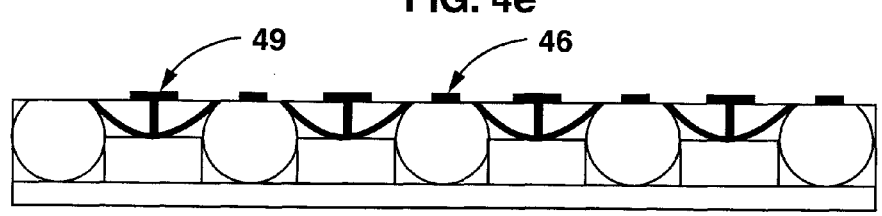

As was mentioned heretofore, this invention also allows for the manufacture of solar cells using a similar fabrication method. Turning now to FIGS. 4a through 4f a process of manufacturing solar cells is shown, wherein spheres 16 doped with p-type material shown in FIG. 4a are located in openings with a grid 14 and are fixed to the light transmissive substrate 10 they are supported by. In FIG. 4b the spheres and grid are coated in a layer 43 of $SiO_2$ and in FIG. 4c a metallization layer 45 is applied. In FIG. 4d the structure is planarized and the spheres have planar upper surfaces 47. In FIG. 4e vias and conducting plug formation 48 is provided. Also not shown in FIG. 4e, the planar region just below the planar surface is doped with n-type material and in a subsequent step in FIG. 4f interconnects 46 and 49 are formed so that all interconnects are on the planar upper surface which contact the p and n material. This upper planarized surface actually forms the backside of the solar panel.

The term planarized particle or particle having a planar surface refers to particles in a preferred embodiment that have a longest dimension across the planar surface of 15 mm and a depth (d) of at least 1 µm normal to the planar surface. Preferably these particles are spheres, spheroids or imperfect spheres or spheroids. However other particle shapes are within the scope of this invention. FIGS. 6a through 6d illustrate various particle shapes 60 and show depth (d) normal to the planar surface of the particle.

Arrays of electronic devices fabricated according to the foregoing description, including but not limited to the electronic device shown in FIG. 5d, can be used as backplanes for active matrix electro-optical devices. These electro-optical devices can include, but are not limited to, displays and imagers. In these devices, the controllable gated electronic components fabricated on and/or beneath the planar surfaces at the planarized cross-sections of the semiconductor particles can be electrically connected to one or more pixels of the optical portion of the electro-optical device. The optical portion can comprise a light-emitting portion in the case of a display and/or a light-detecting portion in the case of an imager. The controllable gated electronic devices, including but not limited to transistors, can be used to control and/or power the light-emitting pixels in the case of a display, and/or to sample the electrical signal from light-detecting pixels in the case of an imager.

Figure 7:
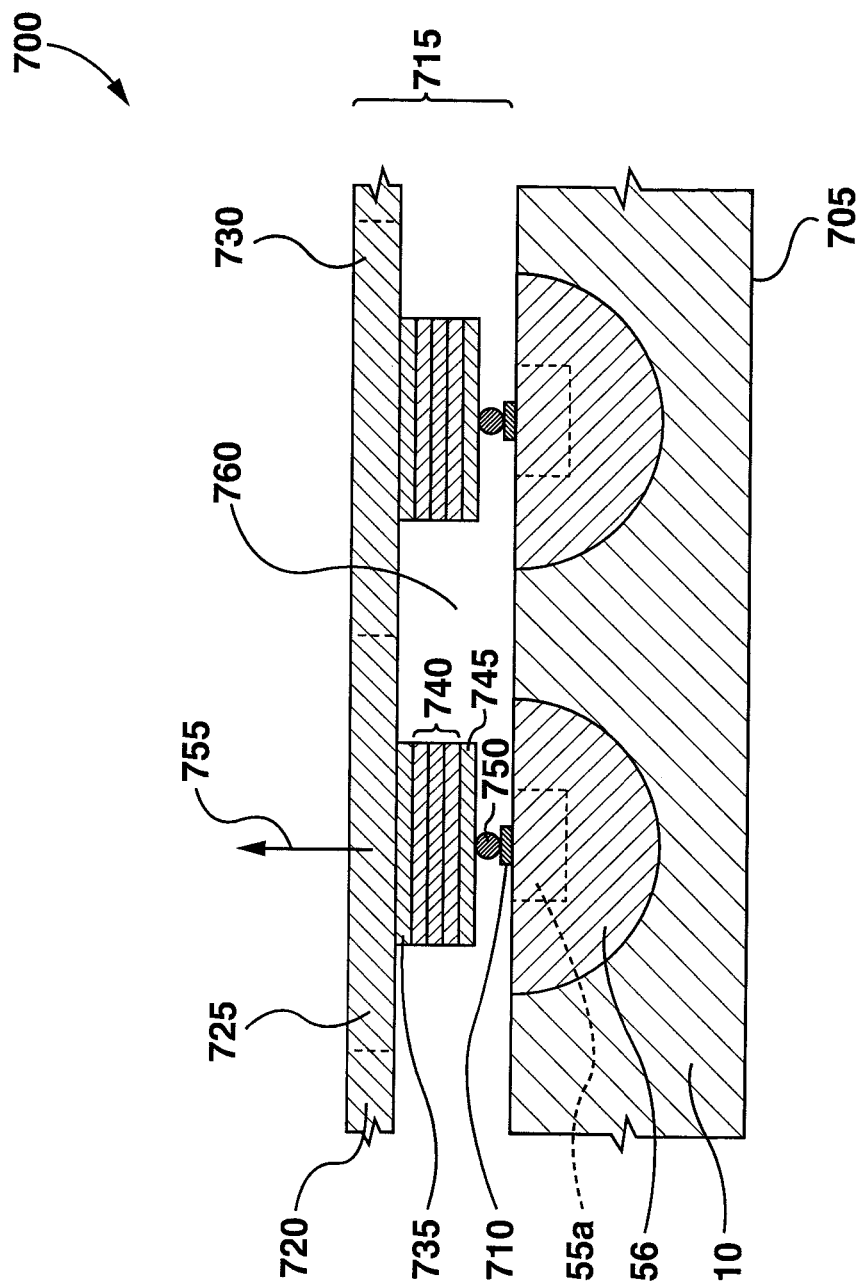
FIG. 7 shows a cross-section of an active matrix display.

FIG. 7 shows a schematic representation of a cross-section of a display 700, comprising a backplane 705 electrically connected to a light emitting assembly. The light emitting assembly can include, but is not limited to, an organic light emitting diode (OLED) assembly 715, in which case display 700 can be an active matrix OLED display. While the following description refers to OLED assemblies, it is contemplated that the light emitting assembly can be any suitable electroluminescent assembly known to the skilled person.

The backplane assembly for display 700 can comprise planarized semiconductor particles, such as planarized spheres 56, secured to substrate 10. Substrate 10 will henceforth be referred to as "backplane substrate 10". For the purposes of this description, substrate 10 and backplane substrate 10 can be interchangeable. One or more controllable gated electronic components, including but not limited to transistor 55*a*, can be formed on and/or beneath the planar surface at the planarized cross-section of planarized spheres 56. While in FIG. 7 only one transistor 55*a* is shown per planarized sphere 56, two or more controllable gated electronic components can be formed on and/or beneath the planar surface at the planarized cross-section of one or more of the semiconductor particles of backplane 705. The controllable gated electronic components can also be of different types and designs, including but not limited to different varieties of transistors. The controllable gated electronic components can also comprise any lithographically patterned circuit element. The following description refers to transistor 55*a*, but it is contemplated that any type and/or variety of suitable circuit element and/or electronic component known to the skilled person can be used instead of and/or in addition to transistor 55*a*.

Contact 710 can be formed on and/or beneath the planar surface at the planarized cross-section of planarized spheres 56. Contact 710 is in electrical contact with transistor 55*a*. In addition and/or alternatively, contact 710 can be in electrical contact with one or more other circuit elements and/or combinations of circuit elements. Such circuit elements can include but are not limited to capacitors. While in FIG. 7 only one contact 710 is shown for transistor 55*a*, it is contemplated that two or more contacts can be formed for each transistor, according to the design of the transistor and/or the number and types of connections needed between transistor 55*a* and pixels of OLED assembly 715. Contact 710 can comprise a deposited layer of a conductive material, including but not limited to a metallic material. In addition and/or alternatively, contact 710 can comprise: metal filled epoxies including but not limited to silver epoxy, carbon filled epoxy, and low temperature solders comprising indium or indium-tin alloys.

OLED assembly 715 can comprise OLED substrate 720 and one or more organic light emitting layers 740 in contact with one or more electrodes. In one embodiment, OLED assembly 715 can comprise one or more pixel regions 725,730. One or more of pixel regions 725,730 can comprise a first electrode 735 deposited on OLED substrate 720, one or more organic light emitting layers 740 deposited on first electrode 735, and a second electrode 745 deposited on one of the organic light emitting layers 740 to sandwich at least one of the organic light emitting layers 740 between first electrode 735 and second electrode 745. While FIG. 7 shows each pixel region 725,730 having its own stack of first electrode 735, organic light emitting layers 740, and second electrode 745, it is contemplated that one or more of the first electrode 735 and organic light emitting layers 740 can span multiple pixel regions. While a particular architecture and geometry of OLED assembly 715 is shown and described, it is contemplated that different architectures and geometries of OLED assembly 715 known to the skilled person can also be used for display 700.

OLED substrate 720 can comprise a material at least partially transparent to the light emitted by organic light emitting layers 740. OLED substrate 720 can comprise materials including but not limited to glass, plastic, and polyimide. First electrode 735 can comprise an electrically conductive material at least partially transparent to the light emitted by organic light emitting layers 740. First electrode 735 can comprise indium tin oxide (ITO). In some embodiments, OLED substrate 720 can function also as the first electrode. Second electrode 745 can comprise a layer of conductive material, including but not limited to aluminum and/or copper.

Adjacent pixel regions 725,730 can be distinguished from one another by one or more of separate first electrodes 735, separate organic light emitting layers 740, and/or separate second electrodes 745. In some embodiments, one or more of pixel regions 725,730 can each have two or more distinct second electrodes, which can act as pixel contacts for their respective pixel region. In FIG. 7, dotted lines across OLED substrate 720 demarcate the approximate boundaries of each pixel region 725,730. These dotted lines are for illustration purposes, and do not necessarily represent a physical feature of OLED assembly 715.

An active matrix OLED display can be formed by electrically connecting backplane 705 to OLED assembly 715 such that at least one of the pixel regions 725,730 is electrically connected to corresponding one or more of the controllable gated electronic components, for example, to transistor 55*a*. In FIG. 7, pixel region 725 is shown as being connected to only one contact 710 of transistor 55*a*. In other embodiments, others ways of connecting pixel regions to transistors can include, but are not limited to: one pixel region can be connected to multiple transistor contacts and/or to multiple transistors; one transistor contact 710 and/or one transistor 55*a* can be connected to multiple separate second electrodes, i.e. pixel contacts, of pixel region 725; and one transistor 55*a* can be connected to multiple different pixel regions 725,730.

OLED assembly 715 can be electrically connected to backplane 705 through one or more conductive links 750. Conductive link 750 can connect transistor 55*a* to a corresponding pixel region 725. Conductive link 750 can comprise an electrically conductive bridge between contact 710 and second electrode 745. Conductive link 750 can comprise a soft and/or flexible conductive link. Conductive link 750 can comprise one or more of a conductive epoxy such as silver epoxy, a solder, and a low temperature solder. In some embodiments, transistor 55*a* may not have a preformed contact 710, and conductive link 750 can connect second electrode 745 to transistor 55*a*. In some embodiments, pixel region 725 may not comprise a second electrode 745, and conductive link 750 can connect contact 710 and/or transistor 55*a* directly to at least one the organic light emitting layers 740.

Using a soft and/or conductive link 750 can reduce the likelihood of conductive link 750 damaging organic light emitting layers 740 and/or the likelihood of conductive link 750 causing an electrical short with first electrode 735 as a result of conductive link 750 breaking through second electrode 745 and organic light emitting layers 740. Using a conductive link 750 that can be applied at relatively low temperatures can reduce the likelihood of thermal degradation and damage to organic light emitting layers 740, which can be temperature sensitive.

Active matrix OLED display 700 can be formed by electrically connecting backplane 705 to OLED assembly 715, using conductive links 750 as described above. In order to enable each pixel region 725,730 to be adjacent its corresponding transistor 55*a* prior to connecting the two, prior to joining backplane 705 to OLED assembly 715, backplane 705 and OLED assembly 715 can be aligned with each other. The aligning can be performed using optical or physical markers on one or both of backplane 705 and OLED assembly 715. The aligning can also be performed by placing backplane 705 and OLED assembly 715 in a jig that determines their position relative to one another.

When backplane 705 is joined to OLED assembly 715 by conductive links 750, gaps 760 may remain between backplane 705 and OLED assembly 715. These gaps 760 can be partially or completely filled with a backfill material to further mechanically strengthen the connection between backplane 705 and OLED assembly 715. In addition, the backfill material can be opaque, light scattering, and/or light absorbing in order to reduce and/or eliminate any visible reflections from backplane substrate 10 that might interfere with the image generated by the OLED display 700. In some embodiments, the backfill material can be substantially black. Being substantially black can comprise reflecting a sufficiently small portion of the light incident upon the backplane so that this reflected light would not constitute a human-visible interference with the image generated by the OLED display 700.

During fabrication of OLED display 700, backplane 705 and OLED assembly 715 can be formed separately and then joined together. For example, backplane 705 can be formed according to the foregoing description. OLED assembly 715 can be formed separately from backplane 705 and on OLED substrate 720, which is distinct from backplane substrate 10. Forming OLED assembly 715 separately from forming backplane 705 allows each part of the fabrication process to be optimized independently. In addition, this bifurcated fabrication process allows for separate quality control for the OLED assembly process and the backplane fabrication process. A defect in a batch of backplanes 705 or OLED assemblies 715 would affect only that subcomponent, instead of affecting the entire display 700.

In addition, separate fabrication of OLED assembly 715 can allow for better control over formation of the different components of pixel regions 725,730, including organic light emitting layers 740. OLED substrate 720 and/or first electrode 735 can constitute a more suitable substrate, e.g. flatter or smoother, for depositing organic light emitting layers 740 which can be sensitive to unevenness of the substrate they are deposited on. More consistent deposition of organic light emitting layers 740 can also reduce the likelihood of punch through electrical shorts, which can be caused by damaged organic light emitting layers 740 that allow electrical contact between first electrode 735 and second electrode 745, conductive link 750, and/or contact 710.

To operate OLED display 700, an electrical potential is applied between first electrode 735 and second electrode 745, thereby applying a potential to organic light emitting layers 740. First electrode 735 can be connected to a transistor, power source, and/or an electrical lead on backplane 705, and/or first electrode 735 can be connected to a power source and/or electrical lead independent of backplane 705. Second electrode 745 can be connected to transistor 55a. One or more of the organic light emitting layers 740 can then emit human visible light which can be emitted through first electrode 735 and OLED substrate 720 and out of OLED assembly 715 in the direction of light emission 755. Transistor 55a can power, and/or control the power applied to, the organic light emitting layers 740 to control emission attributes of pixel regions 725,730 including but not limited to brightness and on/off status.

While FIGS. 7-10 show three organic light emitting layers 740, it is contemplated that fewer or more than three organic light emitting layers can be used. When there are multiple organic light emitting layers 740, the layers can comprise different materials.

In some embodiments, each pixel region 725,730 can emit only one color. In other embodiments, pixel regions 725,730 can emit multiple colors. For example, each pixel region 725,730 can have multiple sub-pixel regions each emitting one color. For example, each sub-pixel can emit one of red, green, and blue color light. When pixel regions 725,730 have sub-pixel regions, each sub-pixel region can have its own separate second electrode 745, i.e. its own separate sub-pixel contact. Each sub-pixel region can be controlled by one or more corresponding transistors.

Figure 8:
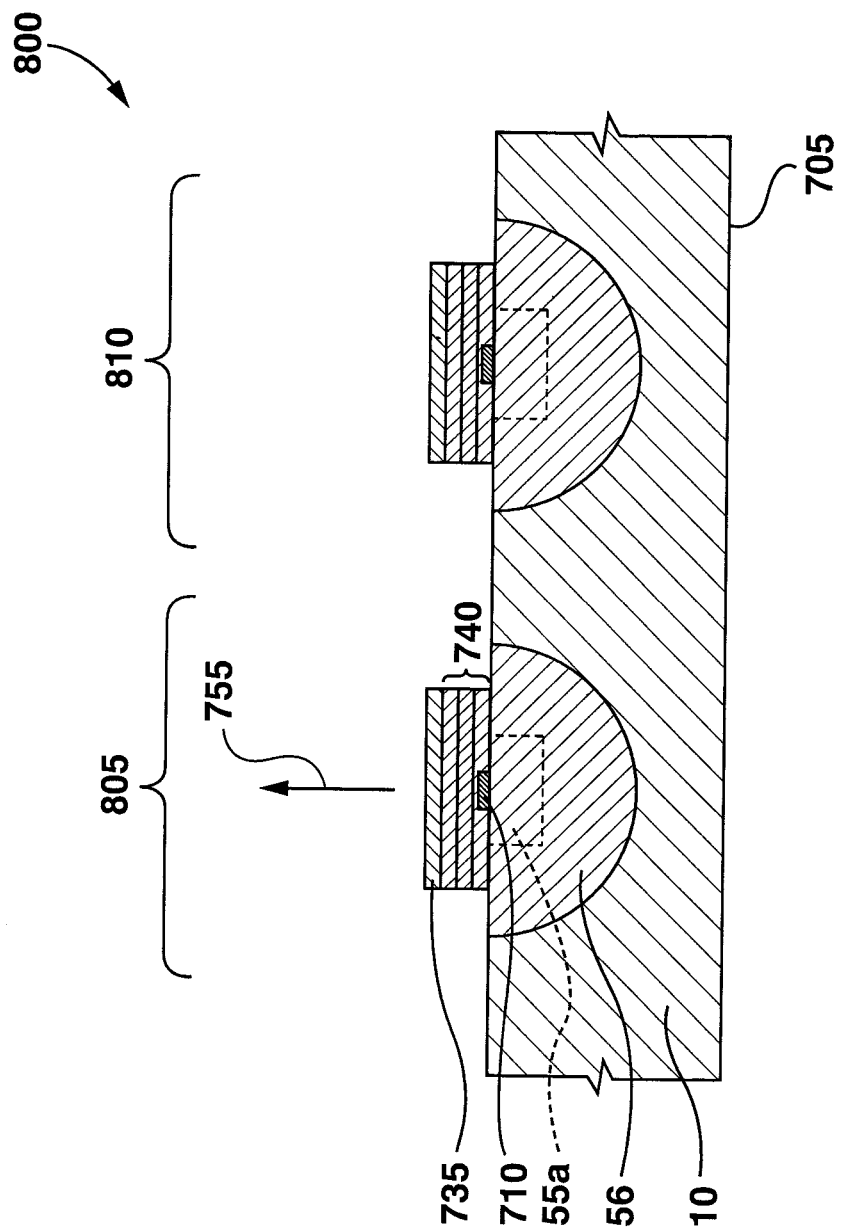
FIG. 8 shows a cross-section of another embodiment of the active matrix display.

FIG. 8 shows a cross-section of active matrix display 800, which can be an active matrix OLED display. Backplane 705 is the same in display 800 as in display 700, and comprises transistors 55a, with contacts 710, formed on and/or beneath the planar surfaces of planarized spheres 56 secured to backplane substrate 10. Display 800 is different from display 700 in that in display 800 the light-emitting assembly is deposited directly onto backplane 705. For example, organic light emitting layers 740 can be deposited directly on planar surface of planarized sphere 56, so that at least one of the organic light emitting layers 740 is in electrical contact with contact 710 of transistor 55a.

First electrode 735 can be deposited onto one of and/or the outer-most of organic light emitting layers 740. While organic light emitting layers 740 and first electrode 735 are shown as forming discrete stacks over each different transistor 55a, it is contemplated that one or more of the organic light emitting layers 740 and/or first electrode 735 can be deposited as a layer spanning multiple transistors 55a.

In some embodiments, organic light emitting layers 740 can be deposited on the surface of backplane substrate 10 outside of the planar surfaces of planarized spheres 56 as well as on the planar surfaces of planarized spheres 56. In some embodiments, the surface of backplane substrate 10 can be coated with a material such as glass encapsulant, vitrified glass, and/or plastics to reduce and/or eliminate the porosity of the surface of backplane substrate 10 before depositing subsequent layers such as organic light emitting layers 740. In some embodiments, there may be a second electrode layer deposited on contact 710, prior to depositing organic light emitting layers 740 and first electrode 735.

First electrode 735 can be connected to a transistor, power source, and/or an electrical lead on backplane 705, and/or first electrode 735 can be connected to a power source and/or electrical lead independent of backplane 705. When a potential is applied between contact 710 and first electrode 735, organic light emitting layers can emit human visible light, in the direction of light emission 755. Similar to display 700, pixel regions 805,810 of display 800 can each emit only one color, or multiple colors. It is contemplated that other layers may be deposited as part of display 800, which layers can include but are not limited to passivation layers, encapsulation layers, and/or protective layers.

Figure 9:
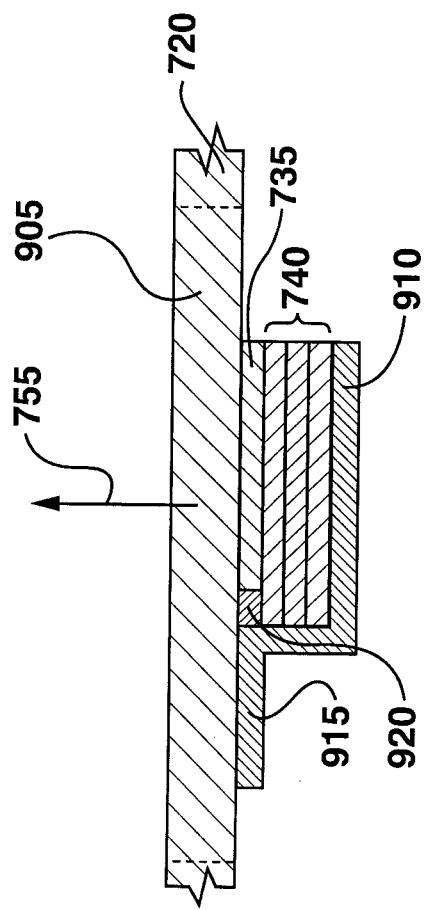
FIG. 9 shows a cross-section of a pixel region of an electroluminescent assembly.

FIG. 9 shows a cross-section of pixel region 905, which can form part of an OLED assembly used to form and OLED display similar to display 700. Pixel region 905 is similar to pixel regions 725,730 in that pixel region 905 comprises an OLED substrate 720, a first electrode 735 formed on OLED substrate 720, organic light emitting layers 740 formed on first electrode 735, and a second electrode 910 formed on organic light emitting layers 740. Pixel region 905 is different from pixel regions 725,730 in that second electrode 910 comprises an extension 915. Extension 915 can span beyond organic light emitting layers 740 and first electrode 735 of pixel region 905. Extension 915 can be formed directly over OLED substrate 720. Second electrode 910 and/or its extension 915 can be insulated from first electrode 735 by insulating region 920. Insulating region 920 can comprise a material and/or medium with sufficiently low electrical conductivity to prevent electrical shorts between first electrode 735 and second electrode 910.

When connecting to backplane 705, conductive link 750 can be formed between contact 710 and extension 915. As the connection point would be insulated and/or spatially removed from first electrode 735, any damage to extension 915 during the connection process is less likely to cause a punch through short between first electrode 735 and second electrode 910. In addition, as extension 915 is spatially removed from organic light emitting layers 740, any thermal, mechanical, and/or chemical damage during the connecting process is less likely to damage the organic light emitting layers 740, which can be susceptible to this type of damage.

Figure 10:
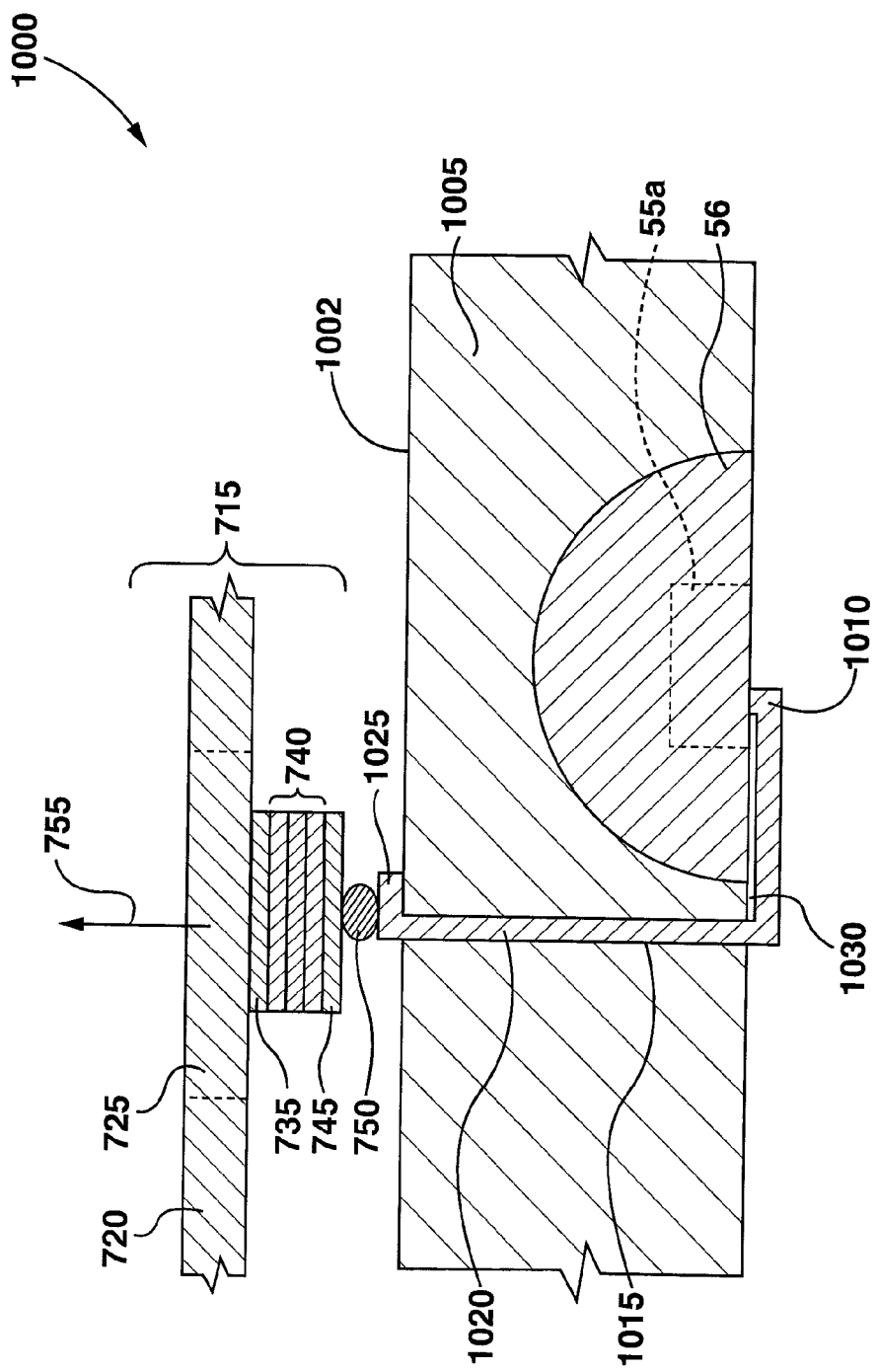
FIG. 10 shows a cross-section of another embodiment of the active matrix display.

FIG. 10 shows active matrix display 1000, which can be an OLED display. Display 1000 is similar to display 700 in that display 1000 comprises OLED assembly 715, having OLED substrate 720, first electrode 735, organic light emitting layers 740, and second electrode 745. When an electrical potential is applied to pixel region 725 across first electrode 735 and second electrode 745, organic light emitting layers 740 can emit human visible light that can pass through first electrode 735 and OLED substrate 720 and be emitted in the direction of light emission 755.

Display 1000 is different from display 700 in the structure of the backplane, in that in display 1000, backplane substrate 1005 comprises one or more vias 1015. Vias 1015 can comprise through passages that connect one face of backplane substrate 1005 to the opposing face. Alternatively and/or in addition, vias 1015 can comprise electrically conductive paths that connect one face of backplane substrate 1005 to the opposing face. Backplane 1002 can comprise transistors 55a formed on and/or beneath the planar surface of planarized spheres 56 secured to backplane substrate 1005. Contact 1010 can be in electrical communication with transistor 55a, have an intermediate portion 1020 that extends through via 1015, and terminate in terminal portion 1025 on or near the face of backplane substrate 1005 opposite the face on which transistor 55a is formed. In embodiments where via 1015 comprises an electrically conductive path, contact 1010 can comprise a conductive link between transistor 55a and a first end of the conductive path. The second end of the conductive path near the opposite face of backplane substrate 1005 can then act as terminal portion 1025 of contact 1010. In these manners, an electrically conductive path can be provided between terminal portion 1025 and transistor 55a. In some embodiments, insulating portion 1030 can electrically insulate some portions of contact 1010 from some portions of planarized sphere 56 and/or transistor 55a.

OLED assembly 715 can electrically connect to backplane 1002 via conductive link 750 between second electrode 745 and terminal portion 1025 of contact 1010. This geometry allows OLED assembly 715 to connect to the face of backplane 1002 opposite the face bearing transistors 55a. Since operation of transistors 55a can generate heat, being able to connect OLED assembly 715 to the face of backplane 1002 opposite the face bearing transistors 55a can distance and at least partially protect OLED assembly 715 from the heat generated by transistors 55a. In particular, organic light emitting layers 740 can be susceptible to damage and/or degradation by heat, so distancing them from heat-generating transistors 55a can reduce the likelihood of thermal damage and prolong the life of OLED assembly 715.

In all the embodiments described above in relation to FIGS. 7-10, the light emitting assembly, such as OLED assembly 715, can be replaced with a detector assembly for detecting photons to yield an imager instead of a display. The detector assembly can detect photons and in response produce an electrical signal. The signal, in turn, can be sampled by a controllable gated electronic component such as transistor 55a and/or other suitable circuit element on the backplane. It is contemplated that the controllable gated electronic components and other circuit elements of an imager can be different than controllable gated electronic components and circuit elements of a display. The detector assembly can be an X-ray detector assembly for converting X-ray photons and in response generating an electrical signal. It is contemplated that the detector assembly can comprise any detector configured to detect an external event and in response produce an electrical signal. For example, the detector can detect external events other than incidence of photons, such as contact with molecules, atoms, and/or subatomic particles.

The above-described embodiments of the invention are intended to be examples of the present invention and alterations and modifications may be effected thereto, by those of skill in the art, without departing from the scope of the invention which is defined solely by the claims appended hereto.

What is claimed is:

1. A method of forming an active matrix OLED display, the method comprising:
   providing a backplane comprising:
      providing a backplane substrate;
      providing semiconductor particles formed separately from the backplane substrate;
      positioning the semiconductor particles at predetermined positions on the backplane substrate;
      immovably fixing the semiconductor particles to the backplane substrate at the predetermined positions;
      after immovably fixing the semiconductor particles, removing portions of each of the semiconductor particles so as to expose cross-sections of the semiconductor particles, wherein the cross-sections are planar surfaces; and
      providing one or more controllable gated electronic components on or directly beneath each planar surface, the controllable gated electronic components configured to control pixels of the active matrix OLED display; and
   providing an OLED assembly comprising one or more pixel regions, the OLED assembly electrically connected to the backplane such that at least one of the pixel regions is electrically connected to corresponding one or more of the controllable gated electronic components.

2. The method of claim 1, wherein:
   the planar surfaces are less than 15 mm and greater than 1 μm across a longest dimension; and
   the providing the backplane further comprises providing at least two electrical contacts to each controllable gated electronic component supported by the planar surface.

3. A method of forming an active matrix OLED display, the method comprising:
   providing a backplane comprising:
      a backplane substrate;
      a semiconductor particle formed separately from the backplane substrate and then fixed upon the backplane substrate at a predetermined position;

the semiconductor particle planarized to remove portions of the semiconductor particle and to expose at a cross-section of the semiconductor particle a planar surface; and a controllable gated electronic component on or directly beneath the planar surface, the controllable gated electronic component configured to control one or more pixels of the active matrix OLED display; and providing an OLED assembly comprising one or more pixel regions, the OLED assembly electrically connected to the backplane such that at least one of the pixel regions of the OLED assembly is electrically connected to the controllable gated electronic component.

4. The method of claim 3, wherein:

the OLED assembly is formed separately from the backplane on an OLED substrate different from the backplane substrate, the OLED assembly comprising one or more pixel contacts corresponding to each pixel region; and the providing the OLED assembly electrically connected to the backplane comprises:
joining the OLED assembly to the backplane, the joining comprising electrically connecting at least one of the pixel contacts corresponding to the at least one of the pixel regions to the controllable gated electronic component.

5. The method of claim 4, further comprising:

before the joining, aligning the OLED assembly and the backplane with each other in order to align the at least one pixel contact corresponding to the at least one of the pixel regions with the controllable gated electronic component.

6. The method of claim 4, further comprising backfilling with a substantially black underfill at least a portion of gaps between the OLED assembly and the backplane joined together.

7. The method of claim 4, wherein the electrically connecting comprises using one or more of a conductive epoxy, a solder, and low temperature solder to connect at least one of the one or more pixel contacts to the controllable gated electronic component.

8. The method of claim 3, wherein the backplane further comprises:

a conformal coating covering the backplane substrate and at least a portion of the semiconductor particle; and wherein:
the semiconductor particle is planarized to further remove portions of the conformal coating;
the planar surface is less than 15 mm across its longest dimension;
at least a portion of the semiconductor particle directly below or on the planar surface is doped with a first dopant of a first type and wherein another portion of the semiconductor particle directly below or on the planar surface is doped with a second dopant of a second type, one of the first and second dopants being n-type; and
the controllable gated electronic component comprises:
a first contact at or above the planar surface contacting the first dopant; and,
a second contact at or above the planar surface contacting the second dopant; and
the electrical connection comprises a conductive link between one of the first contact and the second contact and the at least one pixel region.

9. An active matrix OLED display comprising:
a backplane comprising:
a backplane substrate;
a semiconductor particle formed separately from the backplane substrate and then fixed upon the backplane substrate at a predetermined position;
the semiconductor particle planarized to remove portions of the semiconductor particle and to expose at a cross-section of the semiconductor particle a planar surface; and
a controllable gated electronic component on or directly beneath the planar surface; and
an OLED assembly comprising one or more pixel regions, the OLED assembly electrically connected to the backplane such that at least one pixel region of the OLED assembly is electrically connected to the controllable gated electronic component, the electrical connection configured to allow the controllable gated electronic component to control the at least one pixel region of the OLED assembly.

10. The active matrix OLED display of claim 9, further comprising a substantially black underfill filling at least a portion of gaps between the OLED assembly and the backplane joined together.

11. The active matrix OLED display of claim 9,
wherein the backplane further comprises:
a conformal coating covering the backplane substrate and at least a portion of the semiconductor particle; and
wherein:
the semiconductor particle is planarized to further remove portions of the conformal coating;
the planar surface is less than 15 mm across its longest dimension;
at least a portion of the semiconductor particle directly below or on the planar surface is doped with a first dopant of a first type and wherein another portion of the semiconductor particle directly below or on the planar surface is doped with a second dopant of a second type, one of the first and second dopants being n-type; and
the controllable gated electronic component comprises:
a first contact at or above the planar surface contacting the first dopant; and,
a second contact at or above the planar surface contacting the second dopant; and
the electrical connection comprises a conductive link between one of the first contact and the second contact and the at least one pixel region.

12. An imager comprising:
a detector assembly for detecting photons and, in response, producing an electrical signal;
a backplane comprising:
a backplane substrate;
a semiconductor particle formed separately from the backplane substrate and then fixed upon the backplane substrate at a predetermined position;
the semiconductor particle planarized to remove portions of the semiconductor particle and to expose at a cross-section of the semiconductor particle a planar surface; and
a controllable gated electronic component on or directly beneath the planar surface; and
an electrical connection between the controllable gated electronic component and the detector assembly, the electrical connection configured to allow the controllable gated electronic component to sample the electrical signal.

13. The imager of claim 12, wherein the detector assembly is an X-ray detector.

14. The imager of claim 12,
wherein the backplane further comprises:
   a conformal coating covering the backplane substrate and at least a portion of the semiconductor particle; and
wherein:
   the semiconductor particle is planarized to further remove portions of the conformal coating;
   the planar surface is less than 15 mm across its longest dimension;
   at least a portion of the semiconductor particle directly below or on the planar surface is doped with a first dopant of a first type and wherein another portion of the semiconductor particle directly below or on the planar surface is doped with a second dopant of a second type, one of the first and second dopants being n-type; and
   the controllable gated electronic component comprises:
      a first contact at or above the planar surface contacting the first dopant; and,
      a second contact at or above the planar surface contacting the second dopant; and
   the electrical connection comprises a conductive link between one of the first contact and the second contact and the detector assembly.

15. A method of fabricating a backplane, the method comprising:
providing a backplane substrate comprising one or more predetermined positions each configured to receive one semiconductor particle;
providing semiconductor particles formed separately from the backplane substrate;
placing the semiconductor particles on the backplane substrate;
mechanically agitating the backplane substrate and the semiconductor particles to cause one semiconductor particle to occupy each position;
securing the semiconductor particles to the backplane substrate at each respective position; and
after the securing the semiconductor particles at each respective position, removing portions of each of the semiconductor particles so as to expose cross-sections of the semiconductor particles, the cross-sections being planar surfaces.

16. The method of claim 15, further comprising:
providing at least one controllable gated electronic component on or directly beneath each planar surface.

17. The method of claim 15, wherein the mechanically agitating comprises vibrating the backplane substrate.

18. The method of claim 15, wherein the mechanically agitating comprises one or more of:
rotating the backplane substrate about one or more axes; and
translating the backplane substrate in one or more directions.

19. The method of claim 15, wherein the securing comprises, before the placing the semiconductor particles on the backplane substrate, applying an adhesive to each position, the adhesive configured to secure at least one semiconductor particle at each respective position to the backplane substrate.

20. The method of claim 15, wherein the securing comprises heating the semiconductor particles and the backplane substrate to fuse the semiconductor particles to the backplane substrate.

21. The method of claim 15, wherein:
the securing comprises, after the mechanically agitating, applying a conformal coating onto the backplane substrate to at least partially cover the semiconductor particles and the backplane substrate; and
the removing further comprises removing at least a portion of the conformal coating covering the semiconductor particles to expose the planar surfaces.

* * * * *